United States Patent
Kratzer

(10) Patent No.: US 10,224,188 B2
(45) Date of Patent: Mar. 5, 2019

(54) RF SPUTTERING ARRANGEMENT

(75) Inventor: Martin Kratzer, Feldkirch (AT)

(73) Assignee: EVATEC AG, Trübbach (CH)

( * ) Notice: Subject to any disclaimer, the term of this patent is extended or adjusted under 35 U.S.C. 154(b) by 188 days.

(21) Appl. No.: 12/623,573

(22) Filed: Nov. 23, 2009

(65) Prior Publication Data

US 2010/0126853 A1   May 27, 2010

Related U.S. Application Data

(60) Provisional application No. 61/117,353, filed on Nov. 24, 2008.

(51) Int. Cl.
H01J 37/34   (2006.01)

(52) U.S. Cl.
CPC ...... H01J 37/3408 (2013.01); H01J 37/3438 (2013.01)

(58) Field of Classification Search
CPC .............. H01J 37/3408; H01J 37/3438
USPC ............... 204/298.06, 298.11, 298.14
See application file for complete search history.

(56) References Cited

U.S. PATENT DOCUMENTS

| | | | |
|---|---|---|---|
| 3,514,391 A * | 5/1970 | Hablanian | C23C 14/355 204/298.06 |
| 4,619,755 A * | 10/1986 | Hessberger et al. | 204/298.14 |
| 5,106,474 A * | 4/1992 | Dickey et al. | 204/298.14 |
| 5,605,637 A | 2/1997 | Shan et al. | |
| 6,248,219 B1 | 6/2001 | Wellerdieck et al. | |
| 6,296,747 B1 | 10/2001 | Tanaka | |
| 6,645,357 B2 | 11/2003 | Powell | |
| 6,706,155 B2 * | 3/2004 | Morimoto et al. | 204/192.12 |
| 6,878,249 B2 * | 4/2005 | Kouyama et al. | 204/298.11 |
| 6,905,578 B1 * | 6/2005 | Moslehi et al. | 204/192.12 |
| 8,047,636 B2 | 11/2011 | Fujii | |
| 8,066,857 B2 | 11/2011 | Li | |
| 2002/0029960 A1 | 3/2002 | Morimoto | |
| 2008/0081128 A1 | 4/2008 | Fujii | |

(Continued)

FOREIGN PATENT DOCUMENTS

| | | |
|---|---|---|
| DE | 3 612 721 A1 * | 10/1987 |
| EP | 1187172 A2 | 3/2002 |

(Continued)

OTHER PUBLICATIONS

Machine Translation of DE 3 612 721 A1 dated Oct. 1987.*

(Continued)

*Primary Examiner* — Rodney G McDonald
(74) *Attorney, Agent, or Firm* — Pearne & Gordon LLP

(57) ABSTRACT

Apparatus for sputtering comprises a vacuum chamber defined by at least one side wall, a base and a cover, at least one first electrode having a surface arranged in the vacuum chamber, a counter electrode having a surface arranged in the vacuum chamber and a RF generator. The RF generator is configured to apply a RF electric field across the at least one first electrode and the counter electrode so as to ignite a plasma between the first electrode and the counter electrode. The counter electrode comprises at least a portion of the side wall and/or the base of the vacuum chamber and an additional electrically conductive member. The additional electrically conductive member comprises at least two surfaces arranged generally parallel to one another and spaced at a distance from one another.

16 Claims, 4 Drawing Sheets

(56) References Cited

U.S. PATENT DOCUMENTS

2010/0039481 A1    2/2010  Fujii
2010/0090154 A1    3/2010  Naono

FOREIGN PATENT DOCUMENTS

| EP | 1906433 A1 | 4/2008 |
| GB | 2191787 A | 12/1987 |
| JP | 08-232064 A | 9/1996 |
| JP | 11-229132 A | 8/1999 |
| JP | 11-315376 * | 11/1999 |
| JP | 2000-067432 A | 3/2000 |
| JP | 2002-080962 A | 3/2002 |
| JP | 2005-272941 A | 10/2005 |
| JP | 2005-281851 A | 10/2005 |
| JP | 2008-81083 A | 4/2008 |
| JP | 2008-081803 A | 4/2008 |
| JP | 2010-031343 A | 2/2010 |
| JP | 2010-037566 A | 2/2010 |
| JP | 2010-43330 A | 2/2010 |

OTHER PUBLICATIONS

Machine Translation JP 11-315376 dated Nov. 1999.*
Machine Translation of Baum DE 3612721 A dated Oct. 1987.*
International Search Report for PCT/IB2009/055201 dated Mar. 9, 2010.
Written Opinion for PCT/IB2009/055201 dated Mar. 9, 2010.
Korean Office action for 10-2011-7011767 dated Mar. 14, 2016.

* cited by examiner

RF SPUTTERING ARRANGEMENT

The present invention relates to an arrangement for sputtering by means of high frequency (HF) such as RF (radio frequency).

BACKGROUND

RF sputtering apparatus may include an evacuatable chamber, commonly referred to as a vacuum chamber or plasma reactor, that includes at least two electrodes, between which a plasma can be formed. At least one of the electrodes provides the material to be sputtered and at least one other electrode provides a counter electrode. In RF sputtering, a high frequency voltage is applied between the two electrodes, which continuously alternates in respect of polarity.

It is observed that the electrode with the smaller electrode surface displays a preferential sputtering effect. Therefore, a smaller electrode is typically used as the electrode comprising material to be sputtered and a larger electrode is used as the counter electrode that is typically connected to ground.

The sputtering-off effect is however not completely limited to the smaller electrode area; the extent to which the larger electrode is affected by sputtering depends on the difference between the plasma potential and the potential of the larger electrode. If this difference exceeds the sputtering threshold, the larger electrode will also be sputtered. This is undesirable if the larger electrode comprises one or more elements which are not desired to be sputtered from the larger electrode and deposited onto the substrate.

In order to avoid this effect of sputtering from the larger electrode, the enclosure of the RF sputter arrangement (e.g. a vacuum chamber) may be used as the larger counter electrode. The ratio between smaller electrode area and larger counter electrode area can be 1:10 or higher which is observed to reduce sputtering from the larger electrode.

This design rule of 1:10 however has limits: Certain applications, e.g. the treatment of wafers with 30 cm diameter normally require a sputter target of 40 cm. The 1:10 rule would then result in a counter electrode area of more than 1 $m^2$, which is difficult to arrange in a vacuum sputter chamber.

GB 2 191 787 discloses an arrangement in which a magnetic field is applied at the counter electrode in order to enhance the effect of the counter electrode and reduce sputtering of the counter electrode. The ratio of the counter, electrode area to the target electrode area can be reduced by use of the magnetic field. This enables a counter electrode of a smaller area to be used whilst still avoiding undesirable sputtering from the counter electrode.

However, this approach requires additional magnets which complicates the design and manufacture of the sputtering apparatus. Therefore, further arrangements for RF sputtering are desirable which also reduce the likelihood of sputtering of the counter electrode.

SUMMARY

Apparatus for sputtering comprises a vacuum chamber defined by at least one side wall, a base and a cover, at least one first electrode having a surface arranged in the vacuum chamber, a counter electrode having a surface arranged in the vacuum chamber and a RF generator. The RF generator is configured to apply a RF electric field across the at least one first electrode and the counter electrode so as to ignite a plasma between the first electrode and the counter electrode. The counter electrode comprises at least a portion of the side wall and/or the base of the vacuum chamber and an additional electrically conductive member. The additional electrically conductive member comprises at least two surfaces arranged generally parallel to one another and spaced at a distance from one another.

The additional electrically conductive member and, in particular, the two surfaces arranged generally parallel to one another, provide a counter electrode with an increased surface area compared to a counter electrode without these two surfaces. These surfaces and the additional electrically conductive member can be provided with a compact arrangement as the two surfaces are arranged parallel to one another. Therefore, the additional electrically conductive member occupies a smaller volume within the vacuum chamber than if the surfaces were not arranged parallel to one another. The increased surface area of the counter electrode can be used to reduce sputtering of the material of the counter electrode and avoid contamination of the deposited layers.

In an embodiment, the surfaces of the electrically conductive member are spaced apart a distance such that a plasma can be formed between adjacent surfaces. This enables a uniform and homogenous plasma to be formed within the vacuum chamber which enables material to be deposited onto a substrate or material to be sputtered from a substrate uniformly.

If the apparatus is to be used for depositing material onto a substrate, the first electrode is provided by a target of material to be deposited. Several targets may be provided so that the apparatus comprises a corresponding number of first electrodes.

The additional electrically conductive member may electrically connected to the side wall and/or the base so that the additional electrically conductive member, the side wall and/or the base together provide the counter electrode.

The additional electrically conductive member may be mechanically connected to the side wall and/or the base in order to secure its position. The mechanical connection may also provide the electrical connection to the side wall and/or base.

The surfaces of the additional electrically conductive member may be arranged so as to enable a plasma to be ignited and sustained between one or more of the surfaces and the first electrode. The surfaces of the additional electrically conductive member may extend generally perpendicular to the side wall and/or generally parallel to the base.

The electrically conductive member may arranged in peripheral regions of the vacuum chamber and, in an embodiment, is arranged out of line of sight of the first electrode to a substrate to be sputtered so as not to shadow the substrate and prevent or reduce deposition of material from the first electrode onto regions of the substrate or the removal of material from regions of the substrate.

The additional electrically conductive member have be provided in different forms. In an embodiment, the surfaces of the additional electrically conductive member are integral with the side wall of the vacuum chamber and extend perpendicularly from the side wall. The surfaces may be provided by protrusions from the side wall defining the vacuum chamber, the protrusions being positioned within the vacuum chamber.

The surfaces may also have different forms. In an embodiment, the surfaces of the electrically conductive member are provided by two or more rings. The rings may be circular, square, rectangular and may have a shape corresponding to the lateral shape of the vacuum chamber.

In an embodiment, the rings are arranged in the vacuum chamber, adjacent and spaced apart from the side wall of the vacuum chamber. The rings are provided as separate members. This enables the rings to be removed from the chamber and, if desired, replaced by rings of the same or different dimension. The ratio of the surface area of the counter electrode and the first electrode can, therefore, be varied.

The rings may each comprise a plate or foil comprising a metal or an alloy.

The surfaces provided by the rings are arranged generally in parallel with one another and may be positioned one above another to form a stack of surfaces.

In an embodiment, the rings are spaced apart from one another by one or more bushings.

In a further embodiment, the rings comprise a plurality of through-holes spaced at distances from one another around the rings. A rod is positioned in the through-holes of two or more vertically aligned rings to provide a stack of rings. Bushings may also be provided on the rod. A plurality of rods may be provided which are arranged at intervals circumferally around the ring. The number of rods may be chosen so that the stack of rings has a suitable mechanical stability.

The rod or rods may be attached to the base of the vacuum chamber in order to position the stack within the chamber. The rod may also provide the electrical connection between the rings and surfaces and the further components of the counter electrode such as the base and the side wall.

The rings having a width. In an embodiment, the rings of the additional electrically conductive member comprise the same width. The inner diameter of the rings may be chosen so that the first electrode and the substrate which is to be deposited are not covered up by the rings. The rings are positioned adjacent the first electrode and the substrate.

In a further embodiment, the rings of the electrically conductive member comprise different widths. This arrangement can be used to more fully utilize the available space within the vacuum chamber.

In an embodiment, the width of the rings increases towards the base of the vacuum chamber. This arrangement may be used when the substrate to be deposited in positioned on the base and the first electrode comprising material to be deposited is arranged above the substrate towards the top of the vacuum chamber. Since the target generally has a larger surface area than the substrate in order to achieve a uniform thickness of the deposited layer on the substrate, more space is available adjacent the substrate than adjacent the target. This space can be better utilized if the width of the rings increases towards the base of the vacuum chamber.

The counter electrode has a total surface area Ac within the vacuum chamber and the first electrode has a surface area Ae within the vacuum chamber, wherein Ac>=10.Ae. The surface area of the counter electrode within the vacuum chamber is at least 10 times greater than the surfaces area of the first electrode within the vacuum chamber in order to avoid or reduce sputtering of material from the counter electrode to an acceptable or desired level.

In a further embodiment, two side walls are provided. The side walls extending at least in part parallel to one another and spaced at a distance from one another. A channel for pumping out the vacuum chamber and/or supplying gas to the vacuum chamber extends between the side walls. The channel may have a width of around 1 mm in order to reduce dissipation of the RF energy into the channel and decrease the sputtering rate.

DETAILED DESCRIPTION

Figure 1:
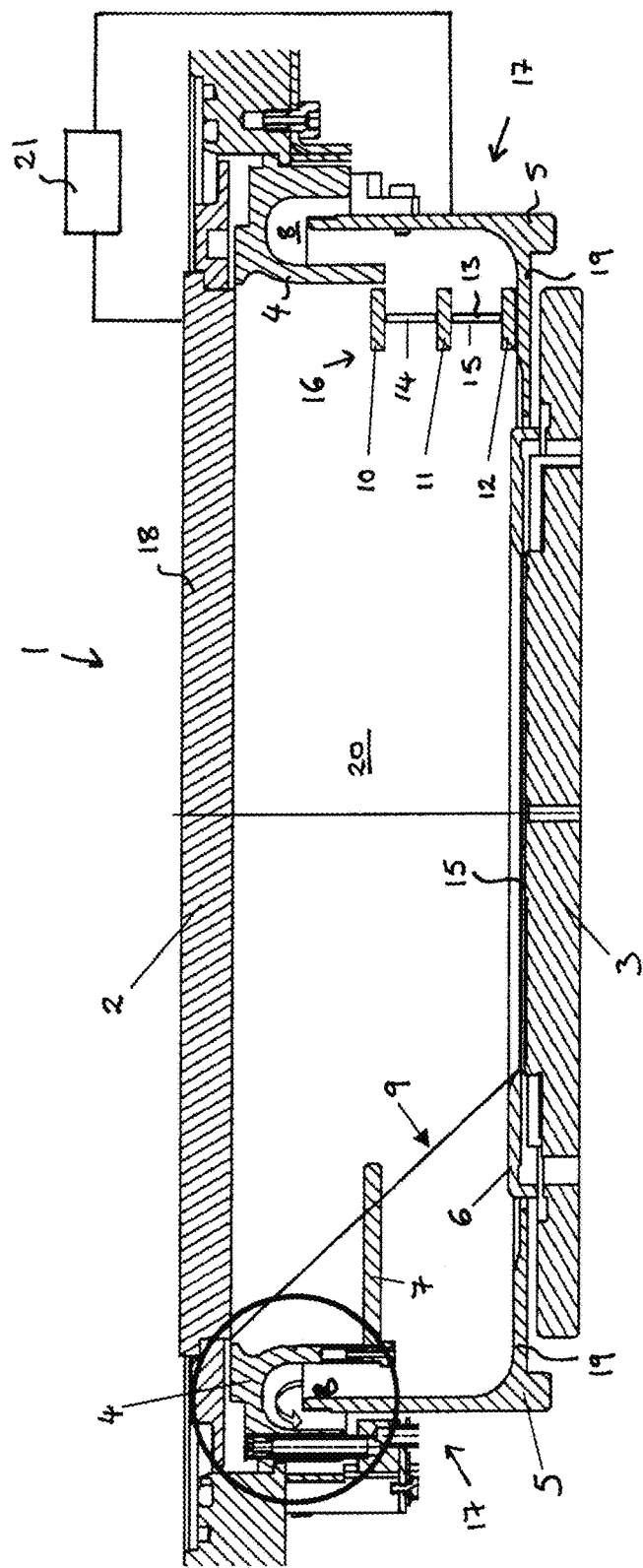
FIG. 1 illustrates a RF sputter arrangement with an counter electrode arrangement according to a comparison (left) and according to a first embodiment of the invention (right).

FIG. 1 shows a RF sputter arrangement 1 as a cut-through of a circular sputter device, integrated into a vacuum chamber 20 defined by side wall elements 4, 5, base 19 and a non-illustrated cover. However, the invention as described in the following is not limited to said circular form.

The sputter arrangement comprises a target 2 to be sputtered and a substrate support 3 e.g. for a semiconductor wafer. The sidewall comprises a first sidewall element 4 and a second sidewall element 5 arranged concentrically outside of the first side wall element 4 thus forming a conduit 8 between the first side wall element 4 and the second side wall element 5 allowing evacuation via a pump (not shown). Working gas may be fed into the vacuum chamber close to the target 2 and be removed via channel 8. The sidewall is not necessarily realised from two parts but may be one part or have three or more parts. Electrical connections have been omitted for clarity.

Target 2 comprises a first electrode 18. The first and second sidewall elements 4, 5 are connected to ground and thus jointly act as a counter electrode 17 across which an electric RF field is applied to ignite a plasma between the first electrode 18 and counter electrode 17. The RF sputter arrangement 1 further includes a RF generator 21 for generating an RF plasma between the first electrode 18 and the counter electrode 17 and optionally non-illustrated magnetic field generating means for generating a magnetic field adjacent the surface of the target 2.

A shield 6 fixes a substrate 15, onto which a layer of material from the target 2 is to be deposited, to the substrate support 3 during operation of the RF sputter arrangement. The shield 6 may have the same potential as the substrate 15 or have a floating potential.

In the comparison RF sputter arrangement illustrated on the left side of FIG. 1, a further conductive element 7 is introduced in order to increase the active area of the counter electrode 17 of side wall elements 4, 5 and base 19. Conductive element 7 can be realised as an aperture-like piece of metal, for example an annular metal ring, which is electrically conductively connected with the sidewall, e.g. first sidewall element 4. This has the advantage that a major fraction of the available counter electrode 17 area is located close to the target 2 and thus good plasma conditions can be achieved in the space between element 7 and target 2.

However, element 7 may screen second sidewall element 5 from the plasma, so that the effectiveness of second sidewall element 5 and the counter electrode 17 decreases considerably. Furthermore, element 7 can block the line of sight 9 between the rim of the target 2 and rim of the substrate 15, which may result in a reduction of coating capability of edge portions of the substrate 15. Further element 7 may also be an obstacle for the gas flow.

If the dimensions of element 7 are chosen to avoid element 7 blocking the line of sight 7, the counter electrode 17 area decreases. However, undesirable sputtering of the counter electrode 17 may occur due to this as well as one or more of the other effects described above.

According to an embodiment of the invention, an additional electrically conductive member 16 is provided which comprises a stack of at least two conductive, electrically connected surfaces 10, 11, 12, spaced apart from one another. In the first embodiment illustrated in the right hand side of FIG. 1, the electrically connected surfaces 10, 11, 12 are arranged in essentially parallel planes and spaced apart from one another by spacers 14, 15. Electrically conductive member 16 is electrically connected with the base 19 and the side wall elements 4, 5 and forms part of the counter electrode 17.

The right hand side of FIG. 1 illustrates that the electrically conductive member 16 comprises a set of electrically conductive rings 10, 11, 12 stacked in parallel planes and providing three electrically connected surfaces. Spacers 13 and 14 are arranged perpendicular to the ring surfaces and control the distance between the rings 10 and 11 and 11 and 12 respectively. The lower ring 13 is positioned directly on the base 19 of the vacuum chamber 20. Rings 10, 11, 12 are electrically connected with each other, e.g. by providing an electrical connection via said spacers 14, 15.

The distance between the rings 10, 11, 12 and thus the length of spacers 14, 15 is chosen such that, at the lowest intended pressure during operation of the RF sputter arrangement, a plasma can ignite in the space between rings 10, 11, 12.

The system may be constructed with a high flexibility regarding process pressures. If the distance between adjacent rings is chosen to lie between 5 to 15 mm, the process pressure may varied between 1 Pa and 0.1 Pa to ignite a plasma, whereby the relationship within this interval is linear. The pressure in the plasma region is identified with "process pressure". If the RF sputter arrangement is equipped with 15 mm spacers, the RF sputter arrangement may be operated over the whole pressure range of 1 Pa and 0.1 Pa.

Figure 2:
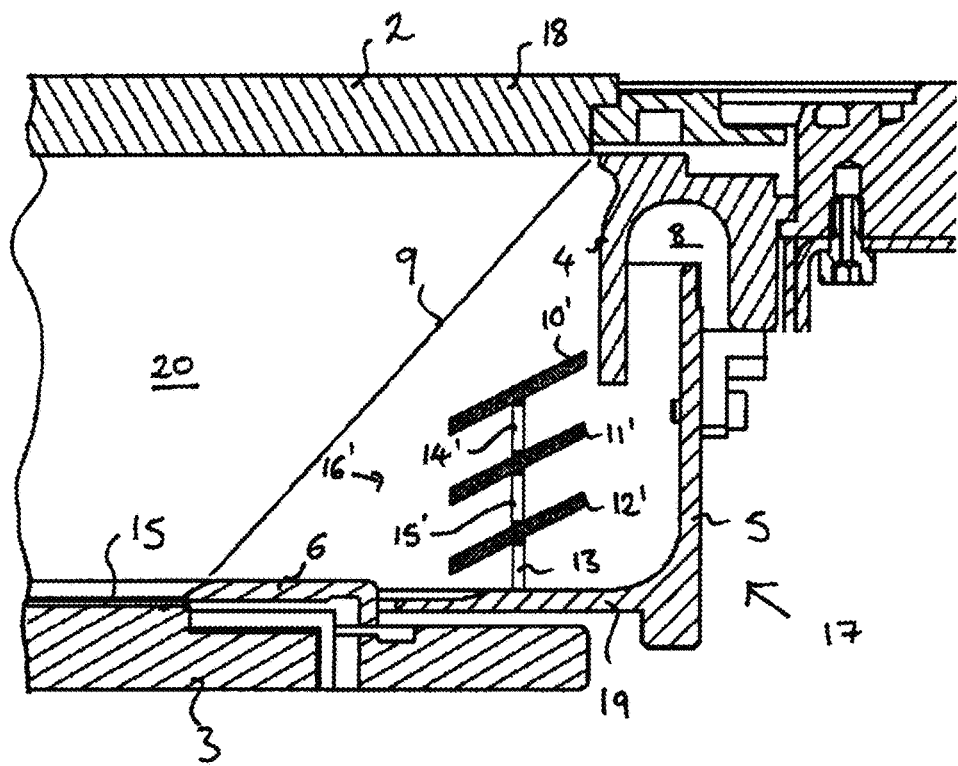
FIG. 2 illustrates a RF sputter arrangement with a counter electrode according to a second embodiment.
Figure 3:
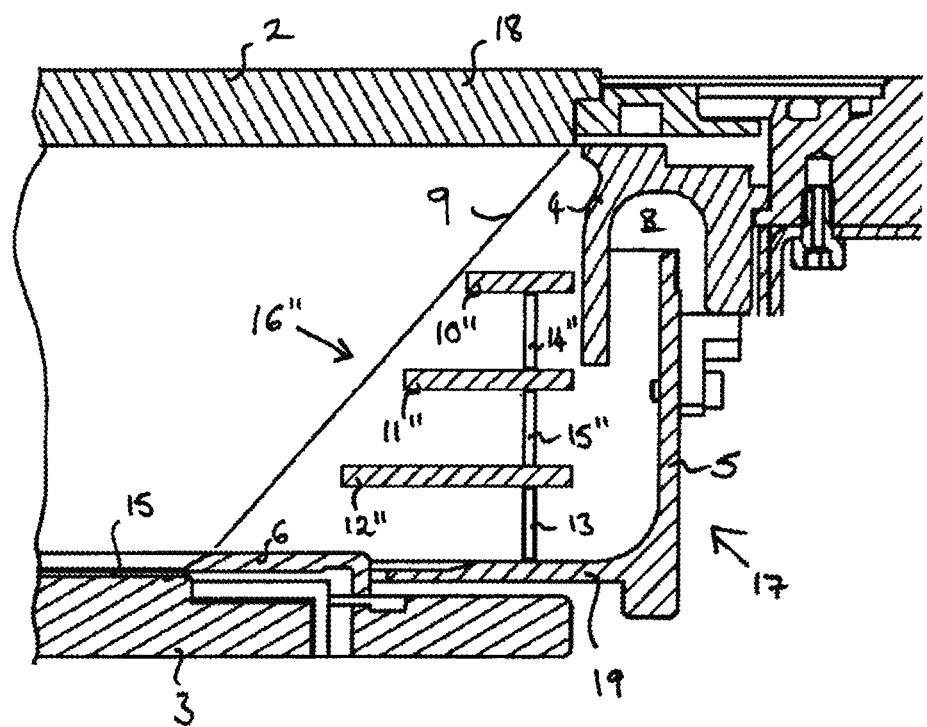
FIG. 3 illustrates a RF sputter arrangement with a counter electrode according to a third embodiment.

Alternative arrangements of the additional electrically conductive member 16 of the counter electrode 17 are illustrated in FIGS. 2 and 3.

The additional electrically conductive member 16' of the second embodiment also includes three rings 10', 11', 12' lying generally parallel to one another and spaced at a distance from one another by spacers 14' 15'. In contrast to the embodiment of FIG. 1, rings 10', 11', 12' are inclined with respect to spacers 14, 15.

In the second embodiment, the rings 10' 11', 12' are inclined downwardly towards the base 19 of the vacuum chamber 20 and point towards the centre of the vacuum chamber 20. This arrangement enables the surface area of each ring 10' 11' 12' to be increased without increasing their effective width, i.e. without increasing the lateral space occupied by the rings 10' 11' 12' within the vacuum chamber 20. The lower ring 12' is not positioned directly on the base 19 but is spaced a distance above the base 19 by an additional spacer in the form of a rod 13. The three rings 10', 11', 12' include a plurality of through holes spaced around the ring at intervals. These through holes are vertically aligned so that a rod 13 is positioned within the through holes to create a stack of rings. The individual rings 10', 11', 12' are spaced above one another at intervals along the height of the rod by means of bushings.

The distance-pressure relationship of the first embodiment still applies to distance between the rings 10', 11', 12', but is not valid for the length of the spacers in the case of the inclined surfaces of the second embodiment.

The line of sight between the rim of the target 2 and the rim of the substrate 15 is illustrated in FIG. 2 by the line 9. FIG. 2 illustrates that the additional electrically conductive member 16' does not cross this line of sight and therefore does not shield the peripheral region of the substrate 15 so that a more uniform coatings can be deposited.

FIG. 3 illustrates an electrically conductive member 16" according to a third embodiment. In the third embodiment, the electrically conductive member also includes three rings 10", 11", 12" spaced apart from one another by two spacers 14", 15". In this third embodiment, the three rings have different widths. The width of the upper ring 10" is smaller than that of middle ring 11", and the width of the middle ring 11" is less than that of the lower ring 12". The width of the rings increases from the top of the stack to the bottom of the stack.

In this embodiment the outer side face of each of the three rings 10", 11", 12" is vertically aligned and the inner face of the three rings 10", 11", 12" is positioned increasingly towards the centre of the vacuum chamber 20 due to the increasing width. The three rings 10", 11", 12" are positioned generally parallel to one another so that each extend generally perpendicular to the side wall 5 and parallel to the base 19. However, the rings may also be inclined as in the second embodiment. The lower ring 12" is also spaced at a distance above the base 19 by means of rod 13 as in the second embodiment.

The arrangement of the increasing width may be chosen so that the additional electrically conductive member 16" occupies as much as of the dead space between the line of sight 9 and the side wall 5 and base 19 of the vacuum chamber 20 as possible. This arrangement uses the effective available space between sidewalls 5 and the line of sight 9 for increasing the counter electrode 17 area by increasing the ring surface.

In all three embodiments, the thickness of the rings may be chosen in order to allow their mechanical and thermal stability. The rings may comprise a metal or an alloy and may be formed from a plate of sheet of the desired material.

The additional electrically conductive member 16, 16' 16" is electrically connected to the further components of the counter electrode 17, side walls 4, 5 in the illustrated embodiments. The additional electrically conductive member 16, 16' 16" may be mechanically and electrically connected to the base 19 and/or side walls 4, 5 the vacuum chamber 20 at one or more points.

The additional electrically conductive member 16, 16' 16" may also be integral with the base of side walls 4, 5 of the vacuum chamber 20. For example, two or more ring shaped protrusions may be provided in the side walls so that two rings spaced one above another are provided. In this case additional spacers are not required since regions of the side wall provide the spacers.

However, the stack may form part of the sidewall itself so that rings protrude from the side wall. The rings of each of the embodiments may have identical shape and/or material to simplify maintenance and provision of spare parts. However, the width of the rings may also be different.

Spacers 14, 15 can be realised as bushings, the whole stack can be assembled by rods 13 or screws joining the rings 10, 11, 12 via said bushings. Although spacers 14, 15 could be realised as a circumferential closed ring, individual, single, column-like elements.

The number of rings providing surfaces arranged generally parallel to one another is not limited to 3. Depending on the available space, fewer or more than three rings can be provided. Rings may be easily cut or stamped from a sheet of metal. However, other structural means are also possible as long as they follow the relationships disclosed above.

Arranging the additional element 16 including at least two surfaces arranged generally parallel to one another to provide areas of the counter electrode 17 having a stacked arrangement reduces the obstacle to the gas flow and does not compromise the goal of increasing the surface area of the counter electrode 17. By appropriately choosing the distance between the rings, the electrical contact between plasma and counter electrode 17 can be optimised.

A RF sputter arrangement according to one of the embodiments described above may be employed for sputtering a PZT target (lead-zirconium-titanate) for piezo-electrical applications. Operation is possible for pressure ranges between 2 and 10 mTorr with a set of 3 rings made from aluminum with width of 30 mm and a thickness of 5 mm. The spacers each have a length of 15 mm. RF frequency is 13.56 MHz.

Figure 4:
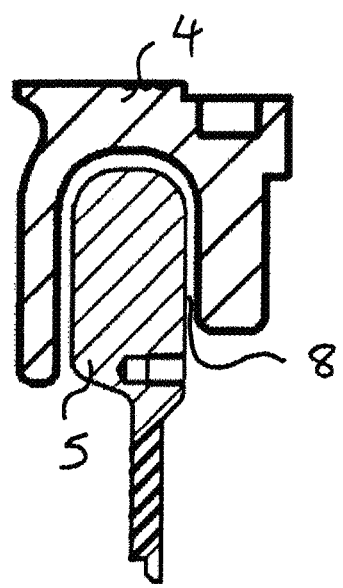
FIG. 4 illustrates a detail of a pumping channel of a vacuum chamber.

In a further embodiment, the channel 8, through which the vacuum chamber is pumped out, has the form illustrated in FIG. 4. It is, in most cases, desirable to allow an obstacle-free access to the pumping lines in vacuum chambers.

In other words constrictions and narrow profiles are avoided. However, RF energy tends to diffuse into openings exceeding the dark space distance. Therefore, conductive grids or mesh may be provided to block RF energy. These grids however require additional effort during maintenance and (re-)installation.

As illustrated in FIG. 4, the channel 8 is narrowed down to an extent so as to safely avoiding substantial loss of RF energy by increasing the head part of second sidewall element 5. Thus a circumferential pumping channel of low profile or cross section is created. As a compensation for loss of pumping cross section, bores at the lower part of second sidewall element 5 are provided. An embodiment of the invention allowing operating the vacuum chambers safely over the entire pressure interval of 1 Pa to 0.1 Pa uses a 2 mm gap between the two side wall elements 4, 5.

The invention claimed is:

1. Apparatus for sputtering, comprising:
   a vacuum chamber defined by at least a first side wall, a second side wall arranged concentrically outside of the first side wall, a base and a cover;
   at least one first electrode having a surface arranged in the vacuum chamber;
   a counter electrode having a surface arranged in the vacuum chamber, and
   a RF generator, the RF generator being configured to apply a RF electric field across the at least one first electrode and the counter electrode, so as to ignite a plasma between the first electrode and the counter electrode,
   wherein the counter electrode comprises at least a portion of the second side wall and/or the base of the vacuum chamber and an additional electrically conductive member, the additional electrically conductive member comprising at least two surfaces arranged generally parallel to one another and spaced at a distance from one another,
   a substrate support for a substrate to be deposited is positioned at the base,
   the first electrode comprises a target of material to be sputtered and the first electrode is arranged above the substrate support towards a top of the vacuum chamber,
   the additional electrically conductive member is mechanically connected to the base of the vacuum chamber,
   a conduit is formed between the first side wall and the second side wall,
   the additional electrically conductive member is positioned within an area bounded by a line of sight between a rim of the target and a rim of the substrate, the first side wall, the second side wall and the base, and
   the additional electrically conductive member does not cross the line of sight, and
   wherein the surfaces of the electrically conductive member are spaced apart a distance between 5 to 15 mm such that plasma can be formed between adjacent surfaces, and
   wherein the surfaces of the electrically conductive member are provided by two or more rings, the rings having a width, wherein the rings of the electrically conductive member comprise different widths, and wherein the width of the rings increases towards the base of the vacuum chamber.

2. The apparatus according to claim 1, wherein the additional electrically conductive member is electrically connected to the first side wall and/or the base.

3. The apparatus according to claim 1, wherein the additional electrically conductive member is mechanically connected to the first side wall.

4. The apparatus according to claim 1, wherein the surfaces of the additional electrically conductive member extend generally perpendicular to the first side wall.

5. The apparatus according to claim 1, wherein the surfaces of the additional electrically conductive member extend generally parallel to the base of the vacuum chamber.

6. The apparatus according to claim 1, wherein the electrically conductive member is arranged in peripheral regions of the vacuum chamber.

7. The apparatus according to claim 1, wherein the surfaces of the electrically conductive member are integral with the side wall of the vacuum chamber and extend perpendicularly from the first side wall.

8. The apparatus according to claim 1, wherein the rings are arranged in the vacuum chamber, adjacent and spaced apart from the first side wall of the vacuum chamber.

9. The apparatus according to claim 1, wherein the rings comprise a plate or foil comprising a metal or an alloy.

10. The apparatus according to claim 1, wherein the rings are spaced apart from one another by one or more bushings.

11. The apparatus according to claim 1, wherein the rings comprise a plurality of the through-holes spaced at distances from one another and a rod is inserted in the through-holes of two or more vertically aligned rings to provide a stack of rings.

12. The apparatus according to claim 11, wherein the rod is attached to the base of the vacuum chamber.

13. The apparatus according to claim 1, wherein the counter electrode has a surface area Ac within the vacuum chamber and the first electrode has a surface area At within the vacuum chamber, wherein $Ac \geq At$.

14. The apparatus according to claim 1, wherein two side walls are provided, the first and second side walls extending at least in part parallel to one another and spaced at a distance from one another.

15. The apparatus according to claim 14, wherein a channel for pumping out the vacuum chamber and/or supplying gas to the vacuum chamber extends between the first and second side walls.

16. The apparatus according to claim 1, wherein the surfaces of the additional electrically conductive member are arranged to enable a plasma to be ignited and sustained between one or more of the surfaces and the first electrode.

* * * * *